US012677681B2

(12) United States Patent
Wang et al.

(10) Patent No.: US 12,677,681 B2
(45) Date of Patent: Jul. 7, 2026

(54) ELECTRONIC PACKAGE STRUCTURE AND METHOD FOR MANUFACTURING THE SAME

(71) Applicant: Advanced Semiconductor Engineering, Inc., Kaohsiung (TW)

(72) Inventors: Wei-Jen Wang, Kaohsiung (TW); Po-Jen Cheng, Kaohsiung (TW); Fu-Yuan Chen, Kaohsiung (TW); Kao Hsin Chen, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 739 days.

(21) Appl. No.: 17/548,328

(22) Filed: Dec. 10, 2021

(65) Prior Publication Data

US 2023/0187367 A1     Jun. 15, 2023

(51) Int. Cl.
*H10W 72/20* (2026.01)
*H10W 70/60* (2026.01)
*H10W 70/63* (2026.01)
*H10W 70/65* (2026.01)

(52) U.S. Cl.
CPC .......... *H10W 70/65* (2026.01); *H10W 70/611* (2026.01); *H10W 70/635* (2026.01); *H10W 72/20* (2026.01)

(58) Field of Classification Search
CPC .. H01L 23/5386; H01L 23/5384; H01L 24/14
See application file for complete search history.

(56) References Cited

U.S. PATENT DOCUMENTS

| | | | | |
|---|---|---|---|---|
| 9,597,752 | B2 * | 3/2017 | Cheng ................... | B23K 35/264 |
| 10,515,936 | B1 * | 12/2019 | Chang Chien .......... | H01L 24/19 |
| 2010/0059244 | A1 * | 3/2010 | Ishii ........................ | H01L 24/11 174/50.5 |
| 2011/0024904 | A1 * | 2/2011 | Egawa ................... | H01L 25/105 257/E21.507 |
| 2011/0233771 | A1 * | 9/2011 | Kwon ............... | H01L 23/49816 257/737 |
| 2012/0193783 | A1 * | 8/2012 | Hong ................ | H01L 23/49811 257/737 |
| 2020/0185326 | A1 * | 6/2020 | Sato ....................... | H01L 21/565 |
| 2022/0415776 | A1 * | 12/2022 | Chen ....................... | H01L 24/32 |

* cited by examiner

*Primary Examiner* — Trang Q Tran
(74) *Attorney, Agent, or Firm* — Foley and Lardner LLP

(57) ABSTRACT

An electronic package structure includes a lower circuit pattern structure, an upper circuit pattern structure, a reflow-able material and at least one core element. The upper circuit pattern structure is disposed above the lower circuit pattern structure. The reflowable material is disposed between the upper circuit pattern structure and the lower circuit pattern structure. The core element attaches to the reflowable material and is configured to inhibit displacement of the at least one core element during a reflow process.

4 Claims, 15 Drawing Sheets

ELECTRONIC PACKAGE STRUCTURE AND METHOD FOR MANUFACTURING THE SAME

BACKGROUND

1. Field of the Disclosure

The present disclosure relates to an electronic package structure and a manufacturing method, and to an electronic package structure including two wiring structures and a method for manufacturing the electronic package structure.

2. Description of the Related Art

A conventional manufacturing process of making a stacked electronic package structure may not provide for a fine enough pitch for a desired application, or portions of the structure may warp or peel, or unwanted bridging may occur between neighboring interconnections. Improved manufacturing techniques are thus desirable.

SUMMARY

In some embodiments, an electronic package structure includes a lower circuit pattern structure, an upper circuit pattern structure, a reflowable material and at least one core element. The upper circuit pattern structure is disposed above the lower circuit pattern structure. The reflowable material is disposed between the upper circuit pattern structure and the lower circuit pattern structure. The core element attaches to the reflowable material and is configured to inhibit displacement of the at least one core element during a reflow process.

In some embodiments, an electronic package structure includes a lower circuit pattern structure, an upper circuit pattern structure, a first reflowable connector and a plurality of core elements. The upper circuit pattern structure is disposed above the lower circuit pattern structure. The first reflowable connector electrically connects the upper circuit pattern structure and the lower circuit pattern structure. The core elements are attached to the first reflowable connector, and are arranged substantially vertically between the lower circuit pattern structure and the upper circuit pattern structure. A melting point of the core elements is higher than a melting point of the first reflowable connector.

In some embodiments, an electronic package structure includes a lower circuit pattern structure, an upper circuit pattern structure, an electronic device and a first reflowable connector. The upper circuit pattern structure is disposed above the lower circuit pattern structure. The electronic device is disposed between the upper circuit pattern structure and the lower circuit pattern structure. The first reflowable connector electrically connects the upper circuit pattern structure and the lower circuit pattern structure and includes an elongated profile along a direction from the lower circuit pattern structure to the upper circuit pattern structure.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
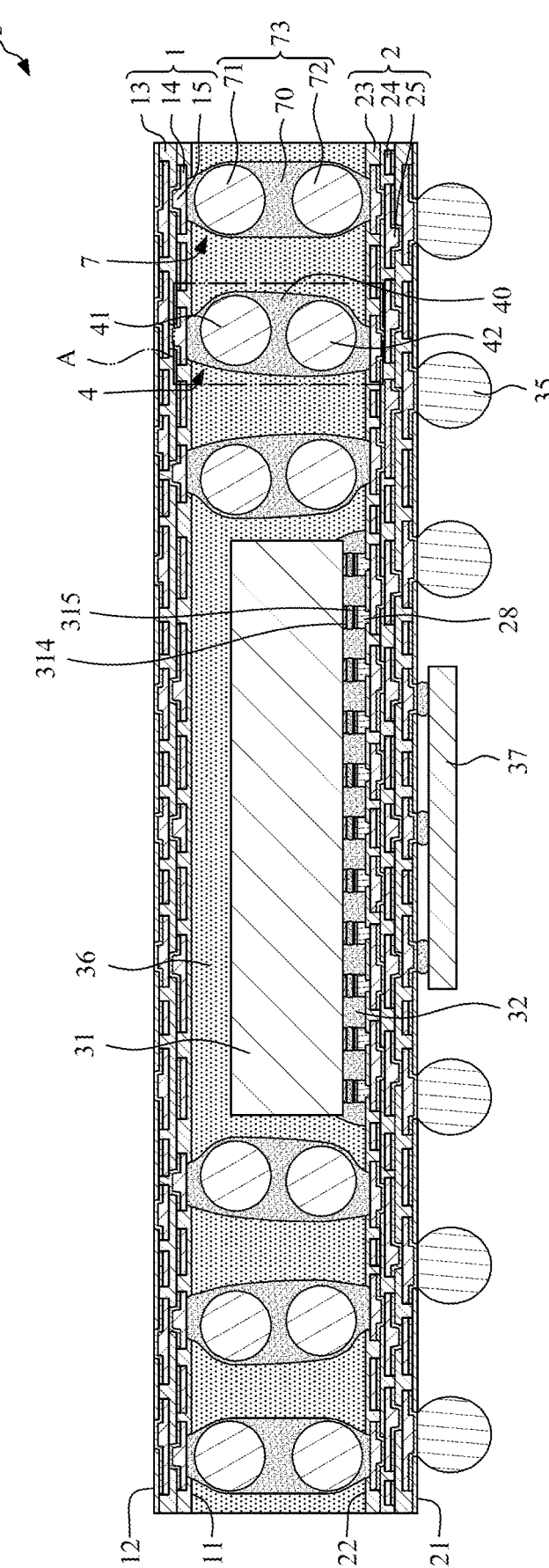
FIG. 1 illustrates a cross-sectional view of an electronic package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples.

This repetition is for the purpose of simplicity and clarity and does not in itself dictate a relationship between the various embodiments and/or configurations discussed.

In a comparative embodiment, a manufacturing process of making a stacked electronic package structure may begin with bonding a die and solder balls to an upper surface of a lower substrate, followed by forming a molding material on the upper surface of the lower substrate to encapsulate the die and solder balls. Once the molding material is solidified, openings may be formed on an upper surface of the molding material to expose an upper portion of each of the solder balls. Next, an upper substrate may be disposed on the molding material such that solder on a lower surface of the upper substrate is in contact with the solder balls. At a first heating stage, the solder and the solder balls may then be fused in an oven to form a number of interconnection elements. When the electronic package structure is moved to the oven for the first heating stage, the lower surface of the upper substrate is in contact with, but not bonded to, the molding material and the solder is in contact with, but not bonded to, the solder balls. Consequently, the upper substrate may move relative to the molding material during the transportation of the electronic package structure.

To address such concerns, interconnection elements between the upper substrate and the lower substrate may be formed in an early stage in the manufacturing process, followed by a molding stage to form a molding material between the upper and lower substrates. Such interconnection elements may be formed, for example, by fusing the solder balls on the upper substrate and the lower substrate. However, because the solder balls of the upper substrate and the lower substrate are melted concurrently, the melted interconnection elements may not provide a sufficient stand-off between the upper substrate and the lower substrate. Therefore, height control may be difficult between the upper and lower substrates.

To address such concerns, the interconnection element may be formed by a tall copper pillar to replace the solder balls. However, the plating process of the tall copper pillar may be time-consuming, and the cost of the plating process may be relatively high.

At least some embodiments of the present disclosure provide for an electronic package structure which may reduce unwanted bridging between adjacent interconnection elements. At least some embodiments of the present disclosure further provide for techniques for manufacturing the electronic package structure and the assembly structure. Thus, the electronic package structure and techniques of the present disclosure are suitable for fine-pitch applications.

Figure 2:
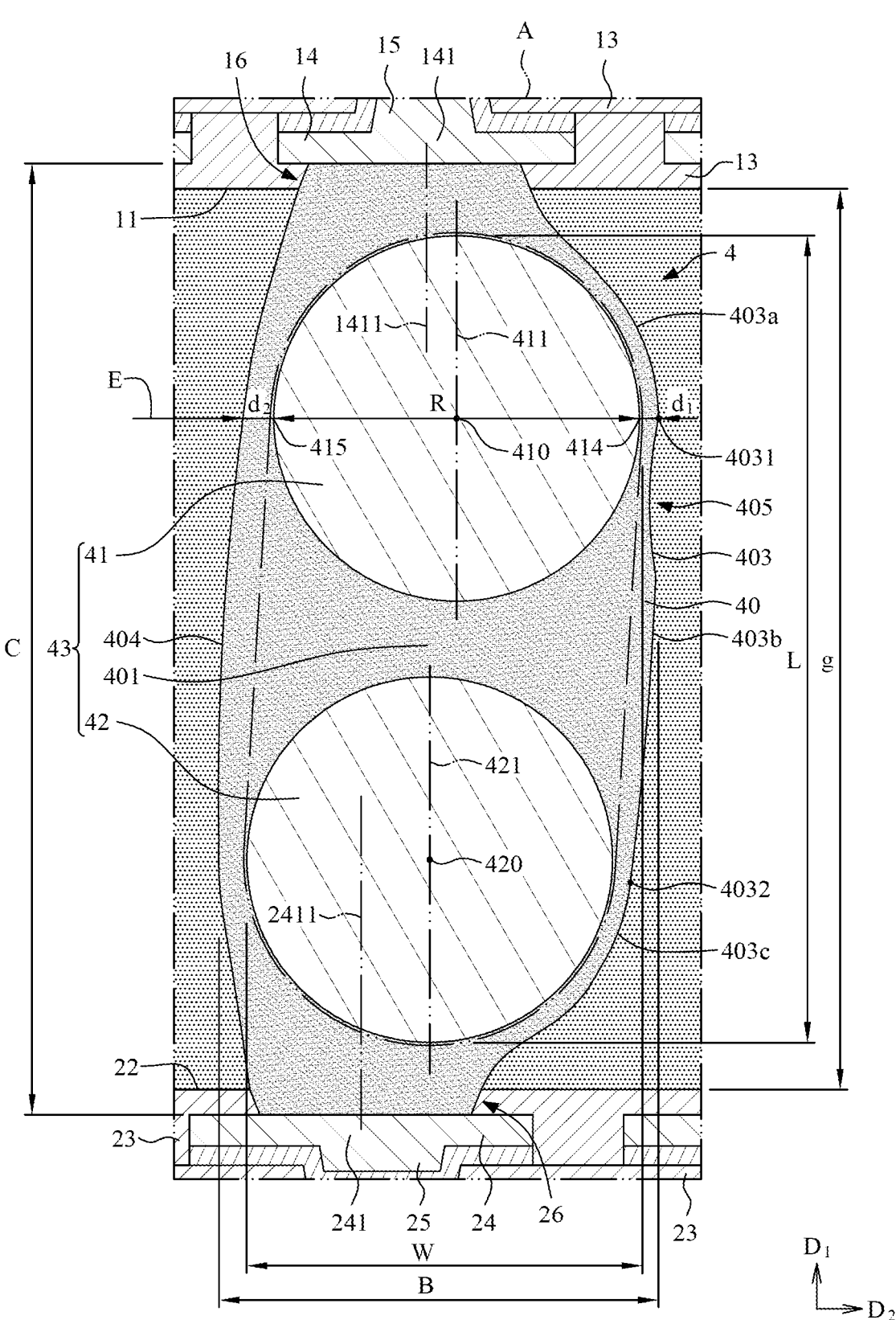
FIG. 2 illustrates an enlarged view of an area "A" of FIG. 1.

FIG. 1 illustrates a cross-sectional view of an electronic package structure 3 according to some embodiments of the present disclosure. FIG. 2 illustrates an enlarged view of an area "A" of FIG. 1. The electronic package structure 3 may include an upper circuit pattern structure 1, a lower circuit pattern structure 2, a first interconnection structure 4, a second interconnection structure 7, an electronic device 31, an encapsulant 36, a capacitor 37 and a plurality of external connectors 35.

The upper circuit pattern structure 1 is disposed above the lower circuit pattern structure 2. The upper circuit pattern structure 1 may be physically connected and electrically connected to the lower circuit pattern structure 2 through the first interconnection structure 4. The upper circuit pattern structure 1 may be a redistribution layer (RDL) structure, a wiring structure or a substrate structure, and may be disposed on the top surface of the encapsulant 36. As shown in FIG. 1, the upper circuit pattern structure 1 is a redistribution layer (RDL) structure. The upper circuit pattern structure 1 may have a first surface 11 (e.g., a bottom surface) and a second surface 12 (e.g., a top surface) opposite to the first surface 11. The upper circuit pattern structure 1 may include at least one dielectric layer 13, at least one circuit layer 14 (or a redistribution layer) and at least one inner via 15. As shown in FIG. 1, the upper circuit pattern structure 1 may include three dielectric layers 13, two circuit layers 14 and a plurality of inner vias 15. However, the amount of the dielectric layers 13 and the amount of the circuit layers 14 are not limited in the present disclosure. The dielectric layer 13 may be made of a cured photoimageable dielectric (PID) material such as epoxy or polyimide (PI) including photoinitiators. The dielectric layers 13 may cover the circuit layers 14, and may be stacked on one another. The inner vias 15 may connect the circuit layers 14. The inner via 15 may taper upward. Thus, a width of the inner via 15 may decrease upward.

As shown in FIG. 1, a bottommost dielectric layer 13 may define a plurality of openings 16 recessed from the first surface 11 (e.g., the bottom surface) of the upper circuit pattern structure 1, so that the first interconnection structure 4 may be physically connected and electrically connected to a bottommost circuit layer 14 through the openings 16 of the bottommost dielectric layer 13. The circuit layer 14 may include a seed layer and a conductive layer disposed thereon. In some embodiments, the seed layer may be omitted. The bottommost circuit layer 14 may include a plurality of first pads 141. Each of the first pads 141 may correspond to a respective one of the openings 16 of the bottommost dielectric layer 13. Thus, the first pads 141 may be exposed from the openings 16 of the bottommost dielectric layer 13, and the first interconnection structure 4 may be physically connected and electrically connected to the first pads 141 of the bottommost circuit layer 14.

The lower circuit pattern structure 2 may be a redistribution layer (RDL) structure, a wiring structure or a substrate structure, and may be disposed on the bottom surface of the encapsulant 36. As shown in FIG. 1, the lower circuit pattern structure 2 is a redistribution layer (RDL) structure. The lower circuit pattern structure 2 may have a first surface 21 (e.g., a bottom surface) and a second surface 22 (e.g., a top surface) opposite to the first surface 21. The lower circuit pattern structure 2 may include at least one dielectric layer 23, at least one circuit layer 24 (or a redistribution layer) and at least one inner via 25. As shown in FIG. 1, the lower circuit pattern structure 2 may include four dielectric layers 23, three circuit layers 24 and a plurality of inner vias 25. However, the amount of the dielectric layers 23 and the amount of the circuit layers 24 are not limited in the present disclosure. The dielectric layer 23 may be made of a cured photoimageable dielectric (PID) material such as epoxy or polyimide (PI) including photoinitiators. The dielectric layers 23 may cover the circuit layers 24, and may be stacked on one another. The inner vias 25 may connect the circuit layers 24. The inner via 25 may taper downward. Thus, a width of the inner via 25 may decrease downward. A tapering direction of the inner via 25 of the lower circuit pattern structure 2 may be different from or opposite to a tapering direction of the inner via 15 of the upper circuit pattern structure 1.

As shown in FIG. 1, a topmost dielectric layer 23 may define a plurality of openings 26 recessed from the second surface 22 (e.g., the top surface) of the lower circuit pattern structure 2, so that the first interconnection structure 4 may be physically connected and electrically connected to a topmost circuit layer 24 through the openings 26 of the topmost dielectric layer 23. The circuit layer 24 may include a seed layer and a conductive layer disposed thereon. In some embodiments, the seed layer may be omitted. The topmost circuit layer 24 may include a plurality of second pads 241. Each of the second pads 241 may correspond to a respective one of the openings 26 of the topmost dielectric layer 23. Thus, the second pads 241 may be exposed from the openings 26 of the topmost dielectric layer 23, and the first interconnection structure 4 may be physically connected and electrically connected to the second pads 241 of the topmost circuit layer 24.

The lower circuit pattern structure 2 may further include a plurality of protrusion pads 28 protruding from the second surface 22 (e.g., the top surface) of the lower circuit pattern structure 2. The conductive pad 28 may extend through the topmost dielectric layer 23 and may electrically connect the topmost circuit layer 24.

The electronic device 31 is disposed adjacent to the second surface 22 of the lower circuit pattern structure 2. The electronic device 31 may be bonded to the lower circuit pattern structure 2, and electrically connected to the circuit layer 24 of the lower circuit pattern structure 2. The electronic device 31 may be a semiconductor device such as an application specific integrated circuit (ASIC) die or a high bandwidth memory (HBM) die. The electronic device 31 may have a bottom surface (e.g., an active surface), a top surface (e.g., a backside surface) opposite to the bottom surface, and a lateral surface extending between the top surface and the bottom surface. Further, the electronic device 31 may include a plurality of electrical contacts 314 disposed adjacent to the bottom surface (e.g., the active surface). The electrical contacts 314 may be exposed or may protrude from the bottom surface (e.g., the active surface) for electrical connection. The electrical contacts 314 may be pads, bumps, studs, pillars or posts. In some embodiments, the electrical contacts 314 of the electronic device 31 may be electrically connected and physically connected to the protrusion pads 28 of the lower circuit pattern structure 2 through a plurality of solder materials 315. In other words, the electronic device 31 may be electrically connected to the lower circuit pattern structure 2 by flip-chip bonding.

As shown in FIG. 1, the electronic device 31 may be disposed between the upper circuit pattern structure 1 and the lower circuit pattern structure 2. A thickness of the electronic device 31 may be greater than a diameter of the first core element 41. An underfill 32 may be further included, and may be disposed in the space between the electronic device 31 and the lower circuit pattern structure 2 so as to cover and protect the joints formed by the electrical contacts 314, the protrusion pads 28 and the solder materials 315. In some embodiments, the underfill 32 may be omitted.

As shown in FIG. 2, the first interconnection structure 4 may include a first reflowable connector 40 and a first assembly 43 in the first reflowable connector 40. The first reflowable connector 40 may include a solder material such as SnAg alloy. The first reflowable connector 40 may be also referred to as "a reflowable material" or "an outer material", and may be disposed between and electrically connect the lower circuit pattern structure 2 and the upper circuit pattern structure 1. The first assembly 43 may include at least one core element or a plurality of core elements (such as a first core element 41 and a second core element 42) attached to the first reflowable connector 40. In some embodiments, the first core element 41 and the second core element 42 may be two discrete standoff elements, and may be disposed between the upper circuit pattern structure 1 and the lower circuit pattern structure 2. The first reflowable connector 40 may be around the core element(s) (e.g., the first core element 41 and the second core element 42). For example, the first reflowable connector 40 may encompass or enclose the core element(s) (e.g., the first core element 41 and the second core element 42). Thus, the first reflowable connector 40 may accommodate or encapsulate the core element(s) (e.g., the first core element 41 and the second core element 42).

Each of the first core element 41 and the second core element 42 may be in a ball shape such as a copper core ball. A size of the first core element 41 is equal to or different from a size of the second core element 42. A melting point of the first core element 41 and the second core element 42 may be higher than a melting point of the first reflowable connector 40. In some embodiments, the core element(s) (e.g., the first core element 41 and the second core element 42) may include a conductive material, and an electrical conductivity of the conductive material of the core element(s) (e.g., the first core element 41 and the second core element 42) is higher than an electrical conductivity of the first reflowable connector 40.

As shown in FIG. 2, the core element(s) (e.g., the first core element 41 and the second core element 42) are arranged along a gap "g" between the lower circuit pattern structure 2 and the upper circuit pattern structure 1. For example, the core element(s) (e.g., the first core element 41 and the second core element 42) are arranged substantially vertically between the lower circuit pattern structure 2 and the upper circuit pattern structure 1. The first core element 41 may be above the second core element 42. A first direction $D_1$ is defined as a direction substantially parallel with the gap "g" between the upper circuit pattern structure 1 and the lower circuit pattern structure 2, and a second direction $D_2$ is defined as a direction substantially perpendicular to the first direction $D_1$. The core element(s) (e.g., the first core element 41 and the second core element 42) may be arranged along the first direction $D_1$. The first reflowable connector 40 may include an elongated profile along the first direction $D_1$ (or the gap) from the lower circuit pattern structure 2 to the upper circuit pattern structure 1.

A distance L between a top end of an upper core element (e.g., the first core element 41) and a bottom end of a lower core element (e.g., the second core element 42) is greater than a distance W between a left end of the core elements (e.g., a left end of the second core element 42) and a right end of the core elements (e.g., a right end of the first core element 41). For example, the distance L of the first assembly 43 may be measured along the first direction $D_1$. The distance W of the first assembly 43 may be measured along the second direction $D_2$. In addition, the distance L of the first assembly 43 is less than a maximum length C of the first reflowable connector 40 measured along the first direction $D_1$. The distance W of the first assembly 43 is less than a maximum width B of the first reflowable connector 40 measured along the second direction $D_2$.

In addition, a central vertical axis (or a central axis) 411 of the first core element 41 along the first direction $D_1$ is vertically misaligned with a vertical axis (or a central axis) 421 of the second core element 42 along the first direction $D_1$. The vertical axis (or a central axis) 411 may pass through a center 410 of the first core element 41, and the vertical axis (or a central axis) 421 may pass through a center 420 of the second core element 42. Thus, there may be a shift between the vertical axis (or a central axis) 411 of the first core element 41 and the vertical axis (or a central axis) 421 of the second core element 42.

A portion 401 of the first reflowable connector 40 may extend to a space between the first core element 41 and the second core element 42. Thus, the first core element 41 may not contact the second core element 42. Further, the first pad 141 contacts the first reflowable connector 40 and is disposed most adjacent to the first core element 41. The first core element 41 is most adjacent to the upper circuit pattern structure 1, and the vertical axis (or a central axis) 411 of the first core element 41 along the first direction $D_1$ is misaligned with a vertical axis (or a central axis) 1411 of the first pad 141 of the upper circuit pattern structure 1 along the first direction $D_1$. In addition, the second pad 241 contacts the first reflowable connector 40 and is disposed most adjacent to the second core element 42. The second core element 42 is most adjacent to the lower circuit pattern structure 2, and the vertical axis (or a central axis) 421 of the second core element 42 along the first direction $D_1$ is misaligned with a vertical axis (or a central axis) 2411 of a pad 241 of the lower circuit pattern structure 2 along the first direction $D_1$.

The first reflowable connector 40 has a first edge 403 and a second edge 404 at different sides of the first reflowable connector 40. The first edge 403 and the second edge 404 may be between the lower circuit pattern structure 2 and the upper circuit pattern structure 1. For example, the first edge 403 may be opposite to the second edge 404. Each of the first edge 403 and the second edge 404 of the first reflowable connector 40 may have at least three different curvatures with different curvature radii from a cross-sectional view. The first edge 403 may have at least one turning point 4031, 4032. The "turning point" is herein defined as a point on an edge which separates two portions of different curvatures. For example, a first portion 403a of the first edge 403 above the turning point 4031 may have a first curvature radius, a second portion 403b of the first edge 403 between the turning point 4031 and the turning point 4032 may have a second curvature radius, a third portion 403c of the first edge 403 under the turning point 4032 may have a third curvature radius. The first curvature radius, the second curvature radius and the third curvature radius may be different from with each other. The second curvature radius may be five times, ten times, twenty times or more times the first curvature radius. In some embodiments, the first edge 403 may define a recess 405 recessed toward the first core element 41 and/or the second edge 404. Thus, the turning point 4031 may be an inflection point.

The first core element 41 has a diameter R. A first horizontal distance $d_1$ is defined as a distance (or a gap) between the first core element 41 and the first edge 403. Thus, the first horizontal distance $d_1$ is defined as a distance between a first outermost end 414 of the first core element 41 and the first edge 403. A second horizontal distance $d_2$ is defined as a distance (or a gap) between the first core element 41 and the second edge 404. Thus, the second horizontal distance $d_2$ is defined as a distance between a second outermost end 415 of the first core element 41 and the second edge 403. As shown in FIG. 2, the diameter R of the first core element 41, the first horizontal distance $d_1$ and the second horizontal distance $d_2$ are at a same elevation E. The diameter R of the first core element 41 is greater than the first horizontal distance $d_1$ and the second horizontal distance $d_2$. The first horizontal distance $d_1$ is different from the second horizontal distance $d_2$. For example, the first horizontal distance $d_1$ may be less than the second horizontal distance $d_2$.

As shown in FIG. 1, the second interconnection structure 7 may include a second reflowable connector 70 and a second assembly 73 in the second reflowable connector 70.

The second interconnection structure 7 may be disposed adjacent to a side of the first interconnection structure 4. Thus, the second reflowable connector 70 may be disposed adjacent to a side of the first reflowable connector 40. The second reflowable connector 70 may include a solder material such as SnAg alloy. The second reflowable connector 70 may be also referred to as "a reflowable material" or "an outer material", and may contact and electrically connect the lower circuit pattern structure 2 and the upper circuit pattern structure 1. The second assembly 73 may include a plurality of core elements (such as a third core element 71 and a fourth core element 72) attached to the second reflowable connector 70. In some embodiments, the third core element 71 and the fourth core element 72 may be two discrete standoff elements, and may be disposed between the upper circuit pattern structure 1 and the lower circuit pattern structure 2. The second reflowable connector 70 may be around the core element(s) (e.g., the third core element 71 and the fourth core element 72). For example, the second reflowable connector 70 may encompass or enclose the core element(s) (e.g., the third core element 71 and the fourth core element 72). Thus, the second reflowable connector 70 may accommodate or encapsulate the core element(s) (e.g., the third core element 71 and the fourth core element 72).

The size, material and arrangement of the second interconnection structure 7, the second reflowable connector 70, the second assembly 73, the third core element 71 and the fourth core element 72 may be similar to or same as the size, material and arrangement of the first interconnection structure 4, the first reflowable connector 40, the first assembly 43, the first core element 41 and the second core element 72, respectively.

The encapsulant 36 may be disposed between the upper circuit pattern structure 1 and the lower circuit pattern structure 2 to encapsulate the electronic device 31, the underfill 32 and the interconnection structure(s) such as the first interconnection structure 4 and the second interconnection structure 7. A material of the encapsulant 36 may be a molding compound with or without fillers.

The capacitor 37 may be disposed under the electronic device 31, and may be electrically connected to the first surface 21 (e.g., the bottom surface) of the lower circuit pattern structure 2. The external connectors 35 (e.g., solder balls or solder bumps) are formed or disposed on the first surface 21 (e.g., the bottom surface) of the lower circuit pattern structure 2 for external connection.

In the embodiment illustrated in FIG. 1 and FIG. 2, since the electrical conductivity of the conductive material of the core element(s) (e.g., the first core element 41 and the second core element 42) is higher than the electrical conductivity of the first reflowable connector 40, the electrical conductivity of the first interconnection structure 4 is improved. In addition, the first reflowable connector 40 may provide for an attachment or adhesion of the core element(s) (e.g., the first core element 41 and the second core element 42) and may be configured to reduce, prevent or inhibit a displacement of the core element(s) (e.g., the first core element 41 and the second core element 42) during a reflow process. In some embodiments, the core elements (e.g., the first core element 41 and the second core element 42) may pull each other through the portion 401 of the first reflowable connector 40 so as to generate less displacement as compared with only one core elements in a reflowable connector.

Thus, the core element(s) (e.g., the first core element 41 and the second core element 42) in the reflowable connector 40 may reduce a lateral extension of the reflowable connector 40 during the reflow process, and two adjacent interconnection structures (e.g., the first interconnection structure 4 and the second interconnection structure 7) may not contact with each other during the reflow process. As a result, short circuit between the interconnection structures (e.g., the first interconnection structure 4 and the second interconnection structure 7) may not occur, and the reliability of the electronic package structure 3 is improved. In addition, the pitch between the interconnection structures (e.g., the first interconnection structure 4 and the second interconnection structure 7) may be fine pitch, and the distribution density of the interconnection structures (e.g., the first interconnection structure 4 and the second interconnection structure 7) may be increased.

Figure 2A:
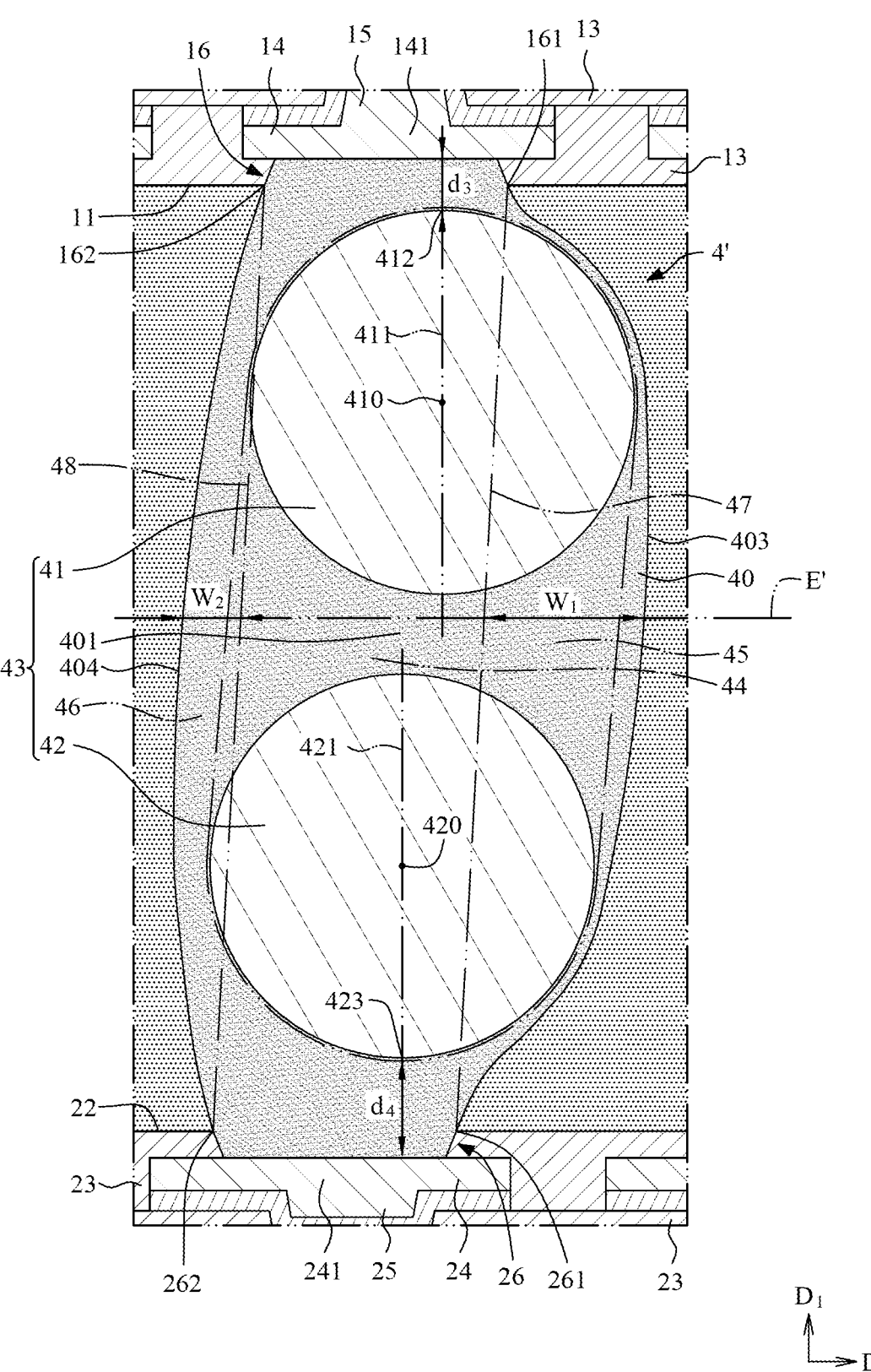
FIG. 2A illustrates a cross-sectional view of an example of a first interconnection structure according to some embodiments of the present disclosure.

FIG. 2A illustrates a cross-sectional view of an example of a first interconnection structure 4' according to some embodiments of the present disclosure. The first interconnection structure 4' of FIG. 2A is similar to the first interconnection structure 4 of FIG. 2, and the differences are described as follows.

The first core element 41 is most adjacent to the upper circuit pattern structure 1, and the second core element 42 is most adjacent to the lower circuit pattern structure 2. In some embodiments, the first core element 41 is adjacent to the upper circuit pattern structure 1, and the second core element 42 is more adjacent to the lower circuit pattern structure 2 than the first core element 41 is. A third distance $d_3$ is defined as a distance (or a gap) between the first core element 41 and the first pad 141 of the upper circuit pattern structure 1. Thus, the third distance $d_3$ is defined as a distance between a topmost end 412 of the first core element 41 and the first pad 141. A fourth distance $d_4$ is defined as a distance (or a gap) between the second core element 42 and the second pad 241 of the lower circuit pattern structure 2. Thus, the fourth distance $d_4$ is defined as a distance between a bottommost end 423 of the second core element 42 and the second pad 241. As shown in FIG. 2A, the third distance $d_3$ is different from the fourth distance $d_4$. For example, the fourth distance $d_4$ may be greater than the third distance $d_3$.

In some embodiments, the first reflowable connector 40 may include a main portion 44, a first protrusion portion 45 and a second protrusion portion 46. The main portion 44 of the first reflowable connector 40 is located within a region extending between the opening 16 of the upper circuit pattern structure 1 and the opening 26 of the lower circuit pattern structure 2. The first protrusion portion 45 of the first reflowable connector 40 protrudes from the main portion 44 and corresponds to the first edge 403. The second protrusion portion 46 of the first reflowable connector 40 protrudes from the main portion 44 and corresponds to the second edge 404. The first protrusion portion 45 and the second protrusion portion 46 are located at different sides of the main portion 44. A width W1 of the first protrusion portion 45 is different from a width W2 of the second protrusion portion 46 at a same elevation E'. For example, a maximum width of the first protrusion portion 45 may be greater than a maximum width of the second protrusion portion 46.

Figure 3:
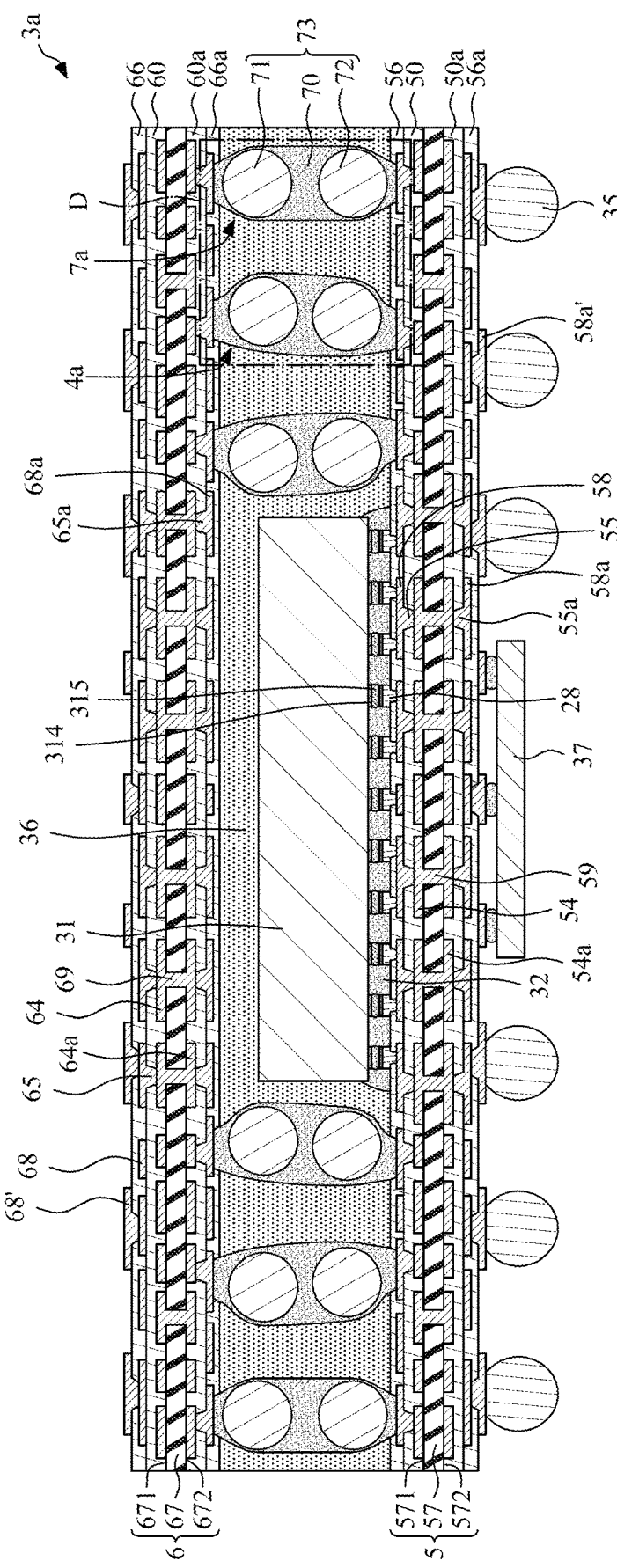
FIG. 3 illustrates a cross-sectional view of an electronic package structure according to some embodiments of the present disclosure.
Figure 3A:
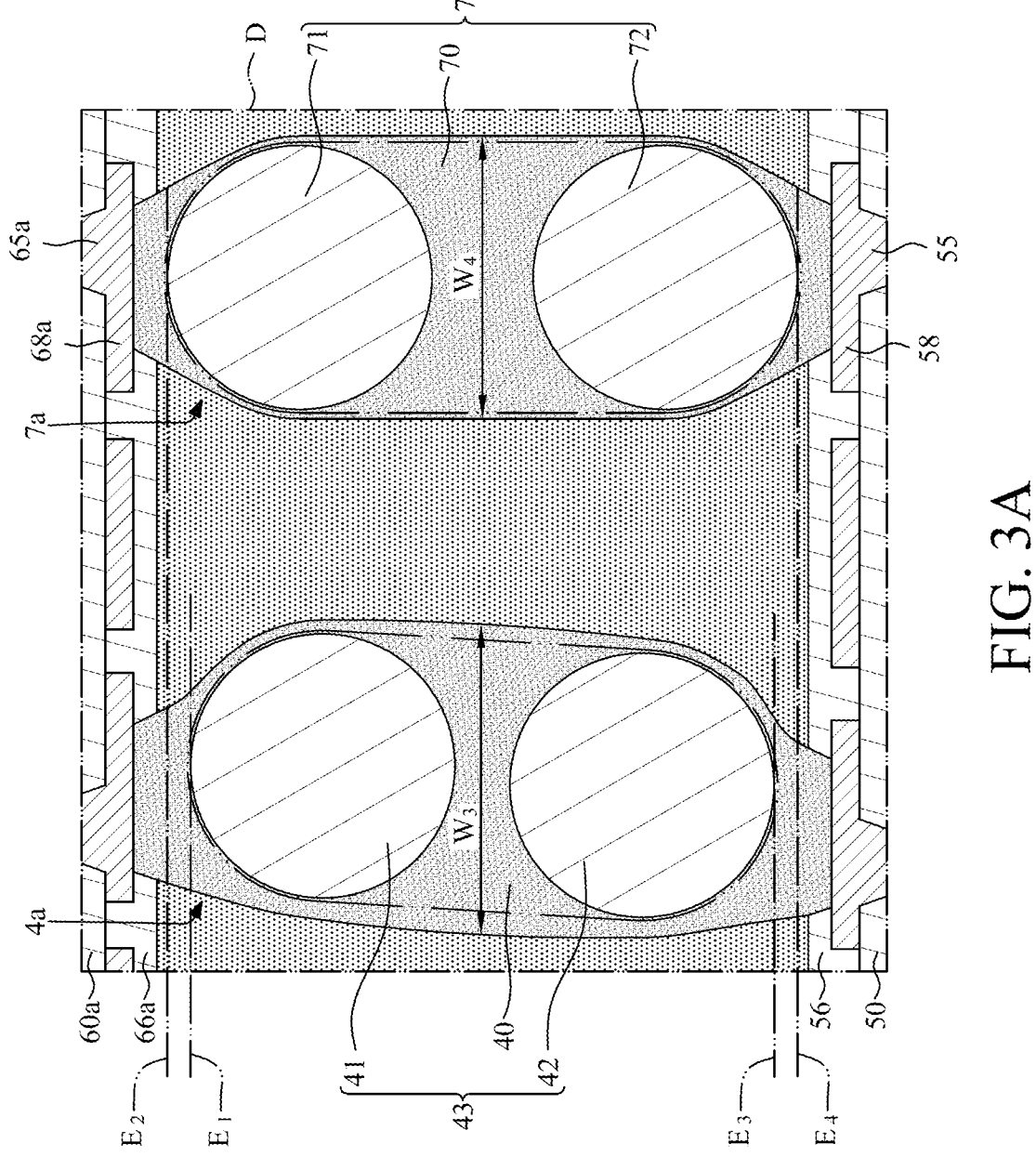
FIG. 3A illustrates an enlarged view of an area "D" of FIG. 3.

FIG. 3 illustrates a cross-sectional view of an electronic package structure 3a according to some embodiments of the present disclosure. FIG. 3A illustrates an enlarged view of an area "D" of FIG. 3. The electronic package structure 3a of FIG. 3 is similar to the electronic package structure 1 of FIG. 1, and the differences are described as follows.

The upper circuit pattern structure 6 of FIG. 3 is a substrate structure. The upper circuit pattern structure 6 includes a plurality of dielectric layers (including, for example, one first upper dielectric layer 60, one second upper dielectric layer 66, one first lower dielectric layer 60a and one second lower dielectric layer 66a), a plurality of circuit layers (including, for example, one first upper circuit layer 64, two second upper circuit layers 68, 68', one first lower circuit layer 64a and one second lower circuit layers 68a formed of a metal, a metal alloy, or other conductive material) in contact with the dielectric layers 60, 66, 60a, 66a, and a plurality of conductive vias (including, for example, a plurality of upper interconnection vias 65 and a plurality of lower interconnection vias 65a). In some embodiments, the upper circuit pattern structure 6 may be similar to a core substrate that further includes a core portion 67. A plurality of interconnection vias 69 may extend through the core portion 67 for vertical connection.

The first upper dielectric layer 60 is disposed on the top surface 671 of the core portion 67. The second upper dielectric layer 66 is stacked or disposed on the first upper dielectric layer 60. In addition, the first lower dielectric layer 60a is disposed on the bottom surface 672 of the core portion 67. The second lower dielectric layer 66a is stacked or disposed on the first lower dielectric layer 60a. For example, the material of the dielectric layers 60, 66, 60a, 66a of the upper circuit pattern structure 6 may be polypropylene (PP) or ajinomoto build-up film (ABF).

In some embodiments, the first upper circuit layer 64 is formed or disposed on the top surface 671 of the core portion 67, and covered by the first upper dielectric layer 60. The second upper circuit layer 68 is formed or disposed on the first upper dielectric layer 60, and covered by the second upper dielectric layer 66. In some embodiments, the second upper circuit layer 68 is electrically connected to the first upper circuit layer 64 through the upper interconnection vias 65. Each upper interconnection via 65 tapers downwardly. In addition, in some embodiments, the second upper circuit layer 68' is disposed on and protrudes from the top surface of the second upper dielectric layer 66. In some embodiments, the second upper circuit layer 68 is electrically connected to the second upper circuit layer 68' through the upper interconnection vias 65.

In some embodiments, the first lower circuit layer 64a is formed or disposed on the bottom surface 672 of the core portion 67, and covered by the first lower dielectric layer 60a. The second lower circuit layer 68a is formed or disposed on the first lower dielectric layer 60a, and covered by the second lower dielectric layer 66a. In some embodiments, the second lower circuit layer 68a is electrically connected to the first lower circuit layer 64a through the lower interconnection vias 65a. The lower interconnection via 65a tapers upwardly. In some embodiments, each interconnection via 69 electrically connects the first upper circuit layer 64 and the first lower circuit layer 64a. In some embodiments, the second lower dielectric layer 66a may define a plurality of openings, and the first interconnection structure 4a and the second interconnection structure 7a may be physically connected and electrically connected to the second lower circuit layer 68a through the openings of the second lower dielectric layer 66a.

The lower circuit pattern structure 5 of FIG. 3 is a substrate structure. The lower circuit pattern structure 5 includes a plurality of dielectric layers (including, for example, one first upper dielectric layer 50, one second upper dielectric layer 56, one first lower dielectric layer 50a and one second lower dielectric layer 56a), a plurality of circuit layers (including, for example, one first upper circuit layer 54, one second upper circuit layer 58, one first lower circuit layer 54a and two second lower circuit layers 58a, 58a' formed of a metal, a metal alloy, or other conductive material) in contact with the dielectric layers 50, 56, 50a, 56a, and a plurality of conductive vias (including, for example, a plurality of upper interconnection vias 55 and a plurality of lower interconnection vias 55a). In some embodiments, the upper circuit pattern structure 5 may be similar to a core substrate that further includes a core portion 57. A plurality of interconnection vias 59 may extend through the core portion 57 for vertical connection.

The first upper dielectric layer 50 is disposed on the top surface 571 of the core portion 57. The second upper dielectric layer 56 is stacked or disposed on the first upper dielectric layer 50. In addition, the first lower dielectric layer 50a is disposed on the bottom surface 572 of the core portion 57. The second lower dielectric layer 56a is stacked or disposed on the first lower dielectric layer 50a. For example, the material of the dielectric layers 50, 56, 50a, 56a of the upper circuit pattern structure 5 may be polypropylene (PP) or ajinomoto build-up film (ABF).

In some embodiments, the first upper circuit layer 54 is formed or disposed on the top surface 571 of the core portion 57, and covered by the first upper dielectric layer 50. The second upper circuit layer 58 is formed or disposed on the first upper dielectric layer 50, and covered by the second upper dielectric layer 56. In some embodiments, the second upper circuit layer 58 is electrically connected to the first upper circuit layer 54 through the upper interconnection vias 55. Each upper interconnection via 55 tapers downwardly.

In some embodiments, the first lower circuit layer 54a is formed or disposed on the bottom surface 572 of the core portion 57, and covered by the first lower dielectric layer 50a. The second lower circuit layer 58a is formed or disposed on the first lower dielectric layer 50a, and covered by the second lower dielectric layer 56a. In some embodiments, the second lower circuit layer 58a is electrically connected to the first lower circuit layer 54a through the lower interconnection vias 55a. The lower interconnection via 55a tapers upwardly. In some embodiments, each interconnection via 59 electrically connects the first upper circuit layer 54 and the first lower circuit layer 54a. In addition, in some embodiments, the second lower circuit layer 58a' is disposed on and protrudes from the bottom surface of the second lower dielectric layer 56a. The second lower circuit layer 58a is electrically connected to the second lower circuit layer 58a' through the lower interconnection vias 55a.

In some embodiments, the second upper dielectric layer 56 may define a plurality of openings, and the first interconnection structure 4a and the second interconnection structure 7a may be physically connected and electrically connected to the second upper circuit layers 58 through the openings of the second upper dielectric layer 56.

As shown in FIG. 3A, an elevation of the second assembly 73 of the core elements 71, 72 in the second reflowable connector 70 of the second interconnection structure 7a is misaligned with an elevation of the first assembly 43 of the core elements 41, 42 in the first reflowable connector 40 of the first interconnection structure 4a. For example, an elevation $E_2$ of a top end of the third core element 71 in the second reflowable connector 70 of the second interconnection structure 7a most adjacent to the upper circuit pattern structure 6 is misaligned with an elevation $E_1$ of a top end of the first core element 41 in the first reflowable connector 40 of the first interconnection structure 4a most adjacent to the upper circuit pattern structure 6. For example, an elevation $E_4$ of a bottom end of the fourth core element 72 in the second reflowable connector 70 of the second interconnection struc-ture 7a most adjacent to the lower circuit pattern structure 5 is misaligned with an elevation $E_3$ of a bottom end of the second core element 42 in the first reflowable connector 40 of the first interconnection structure 4a most adjacent to the lower circuit pattern structure 5. In addition, a width W4 of the second reflowable connector 70 of the second intercon-nection structure 7a is different from a width W3 of the first reflowable connector 40 at a same elevation.

Figure 4:
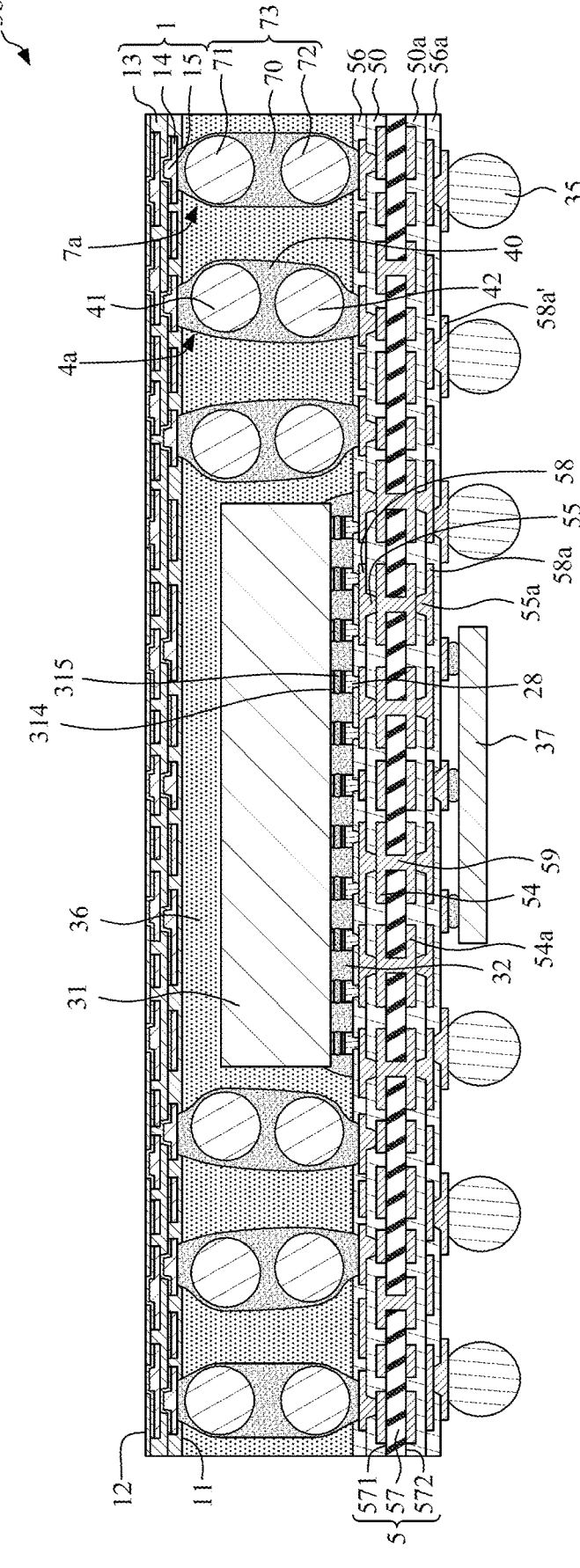
FIG. 4 illustrates a cross-sectional view of an electronic package structure according to some embodiments of the present disclosure.

FIG. 4 illustrates a cross-sectional view of an electronic package structure 3b according to some embodiments of the present disclosure. The electronic package structure 3b of FIG. 4 is similar to the electronic package structure 1 of FIG. 1, except that the lower circuit pattern structure 5 of FIG. 4 is a substrate structure similar to or same as the lower circuit pattern structure 5 of FIG. 3.

Figure 5:
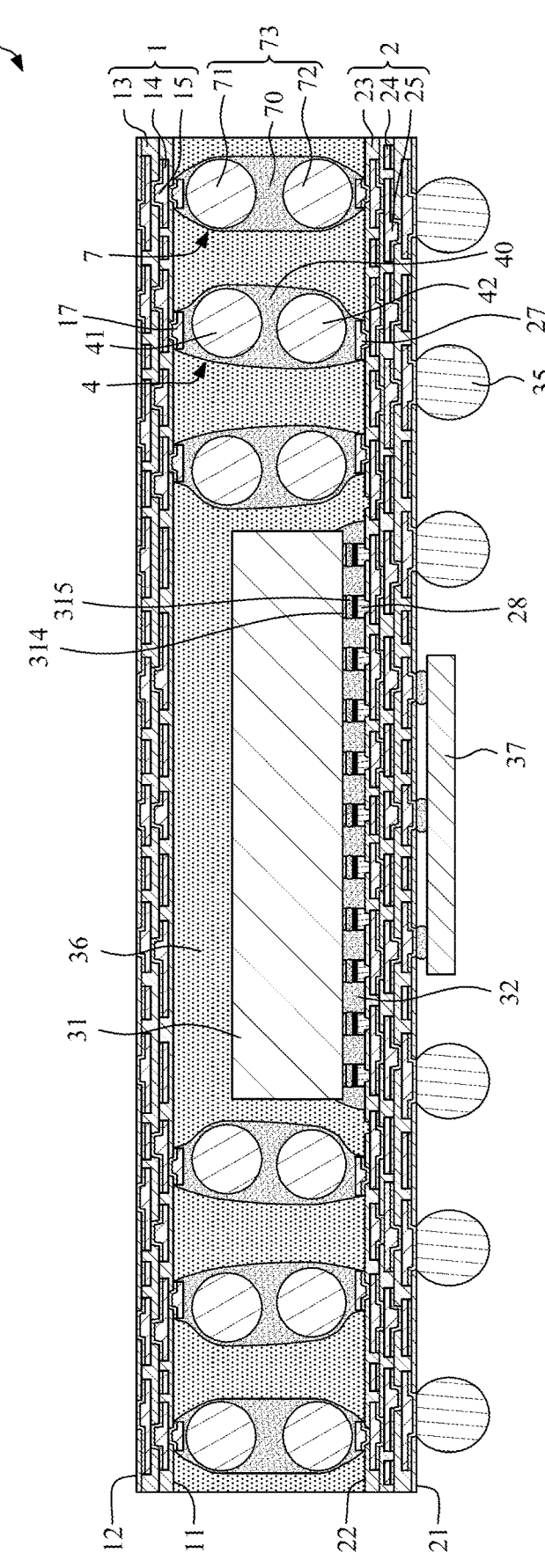
FIG. 5 illustrates a cross-sectional view of an electronic package structure according to some embodiments of the present disclosure.

FIG. 5 illustrates a cross-sectional view of an electronic package structure 3c according to some embodiments of the present disclosure. The electronic package structure 3c of FIG. 5 is similar to the electronic package structure 1 of FIG. 1, except that the upper circuit pattern structure 1 further includes a plurality of under-bump metallurgies (UBMs) 17 disposed on the first surface 11, and the lower circuit pattern structure 2 further includes a plurality of under-bump met-allurgies (UBMs) 27 disposed on the second surface 22. The first reflowable connector 40 and the second reflowable connector 70 cover the UBMs 17, 27

Figure 6:
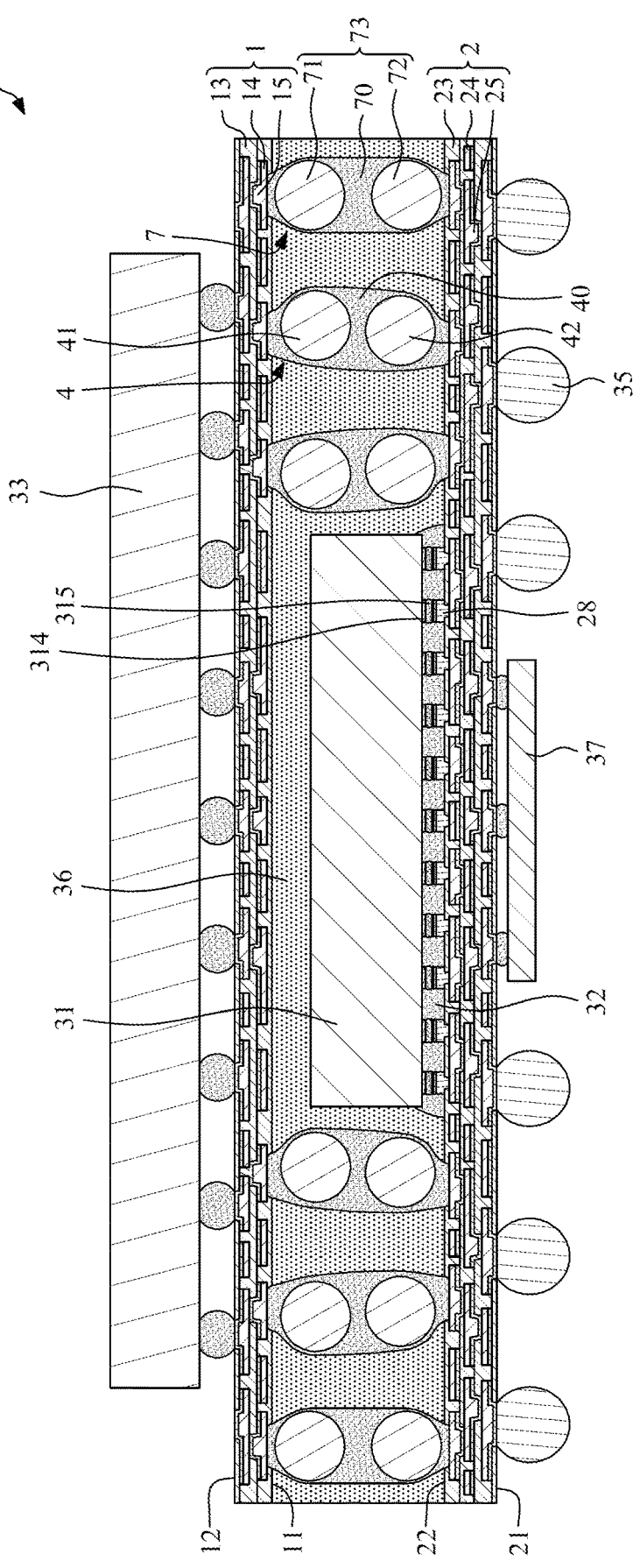
FIG. 6 illustrates a cross-sectional view of an electronic package structure according to some embodiments of the present disclosure.

FIG. 6 illustrates a cross-sectional view of an electronic package structure 3d according to some embodiments of the present disclosure. The electronic package structure 3d of FIG. 6 is similar to the electronic package structure 1 of FIG. 1, except that an electronic device 33 is further disposed on and electrically to the second surface 12 of the upper circuit pattern structure 1. The electronic device 33 may be a semiconductor device such as an application specific inte-grated circuit (ASIC) die or a high bandwidth memory (HBM) die.

FIG. 7 through FIG. 13 illustrate a method for manufac-turing an electronic package structure according to some embodiments of the present disclosure. In some embodi-ments, the method is for manufacturing the electronic pack-age structure 3 shown in FIG. 1.

Figure 7:
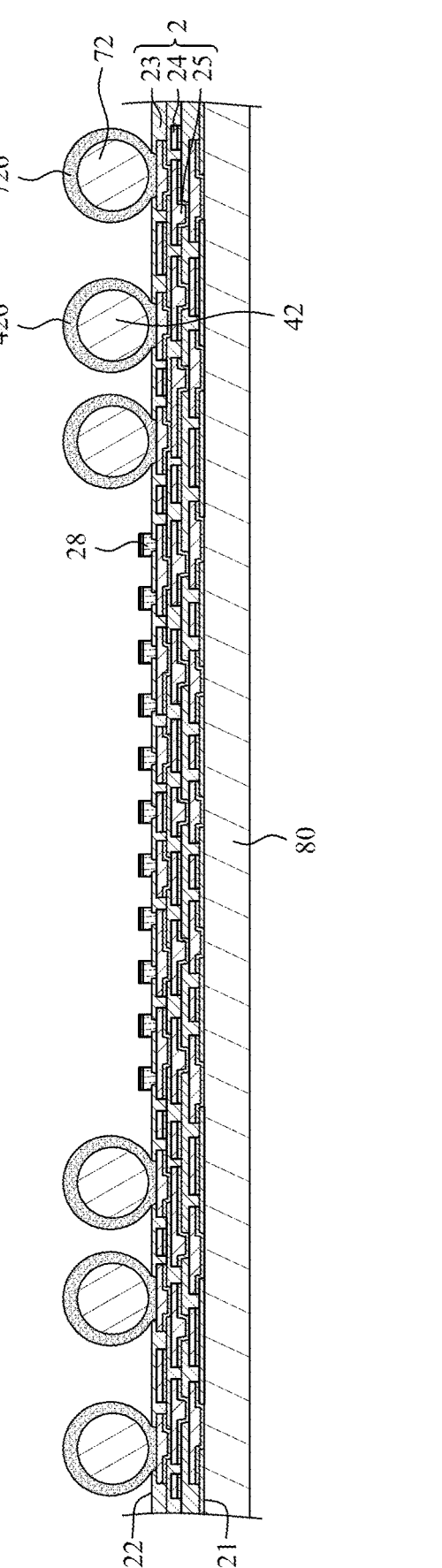
FIG. 7 illustrates one or more stages of an example of a method for manufacturing an electronic package structure according to some embodiments of the present disclosure.

Referring to FIG. 7, a lower circuit pattern structure 2 is formed or disposed on a lower carrier 80. The lower circuit pattern structure 2 of FIG. 7 may be similar to or same as the lower circuit pattern structure 2 of FIG. 1. Then, a plurality of coated core element(s) (e.g., the second core element 42 and the fourth core element 72) are provided or disposed on the second surface 22 of the lower circuit pattern structure 2. The second core element 42 and the fourth core element 72 may be copper-core balls coated with solders 426, 726, and may be disposed aligned with the openings 26 (FIG. 2) or the second pads 241 (FIG. 2) of the lower circuit pattern structure 2.

Figure 8:
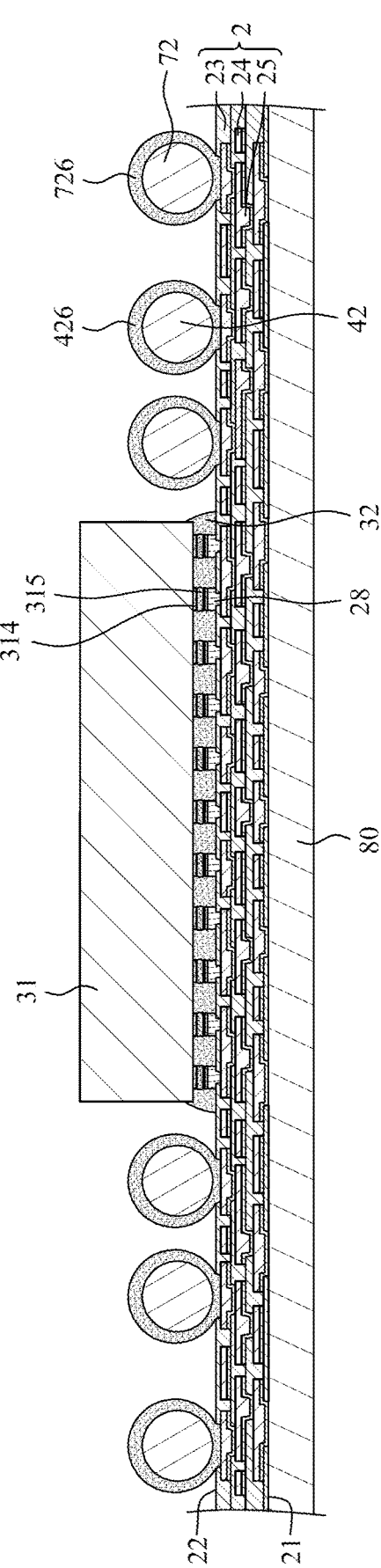
FIG. 8 illustrates one or more stages of an example of a method for manufacturing an electronic package structure according to some embodiments of the present disclosure.

Referring to FIG. 8, the electronic device 31 is bonded to the lower circuit pattern structure 2, and electrically con-nected to the circuit layer 24 of the lower circuit pattern structure 2 through the solder materials 315 and the electri-cal contacts 314.

Figure 9:
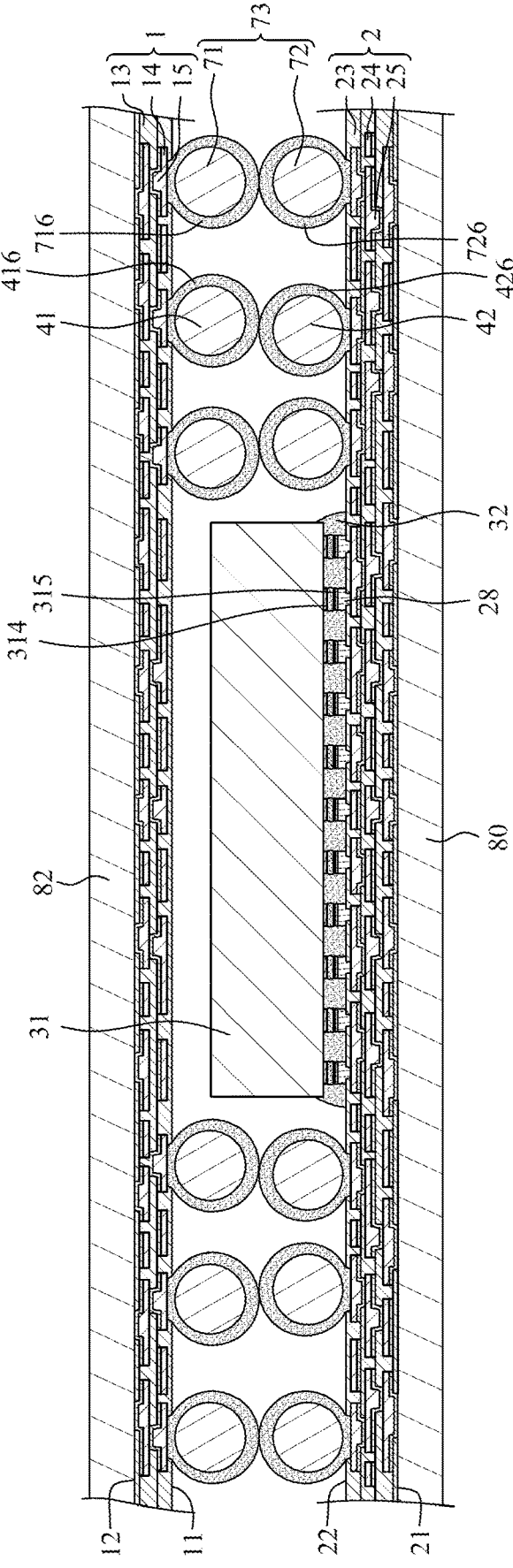
FIG. 9 illustrates one or more stages of an example of a method for manufacturing an electronic package structure according to some embodiments of the present disclosure.

Referring to FIG. 9, an upper circuit pattern structure 1 is formed or disposed on an upper carrier 82. The upper circuit pattern structure 1 of FIG. 9 may be similar to or same as the upper circuit pattern structure 1 of FIG. 1. Then, a plurality of coated core element(s) (e.g., the first core element 4 and the third core element 71) are provided or disposed on the first surface 11 of the upper circuit pattern structure 1. The first core element 41 and the third core element 71 may be copper-core balls coated with solders 416, 716, and may be disposed aligned with the openings 16 (FIG. 2) or the first pads 141 (FIG. 2) of the upper circuit pattern structure 1.

Then, the upper circuit pattern structure 1 is disposed on the lower circuit pattern structure 2. Meanwhile, the solders 416, 716 of the first core element 41 and the third core element 71 may contact the solders 426, 726 of the second core element 42 and the fourth core element 72. The first core element 41 may be aligned or misaligned with the second core element 42. The third core element 71 may be aligned or misaligned with the fourth core element 72.

Figure 10:
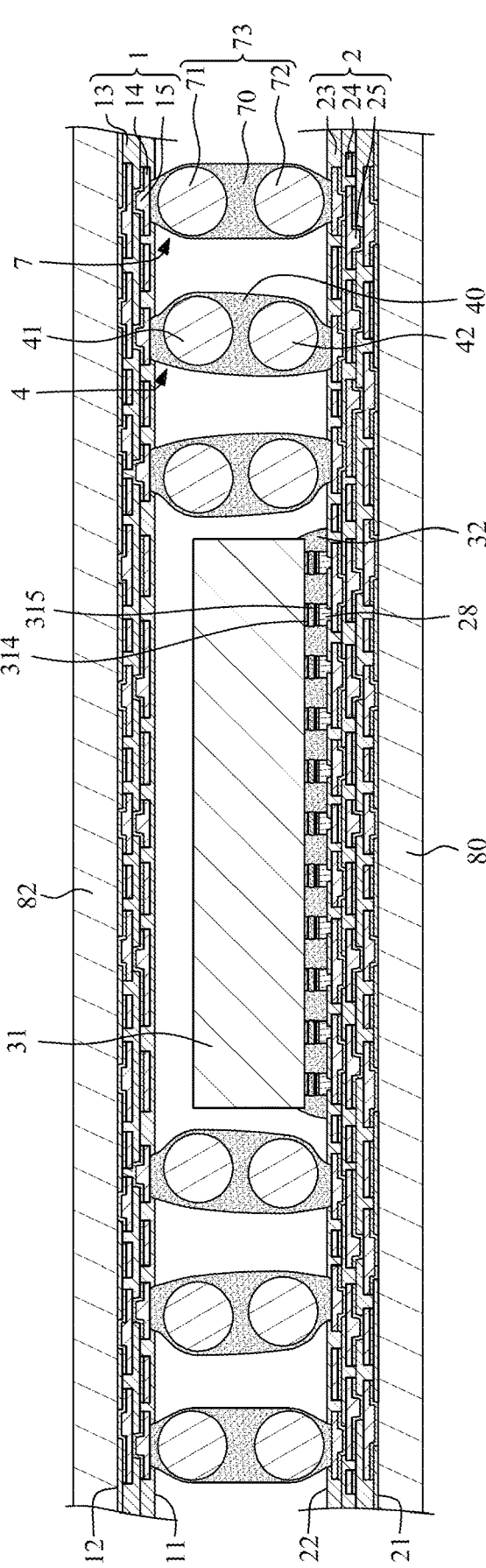
FIG. 10 illustrates one or more stages of an example of a method for manufacturing an electronic package structure according to some embodiments of the present disclosure.

Referring to FIG. 10, a reflow process is conducted, so that the solders coated on upper ball and lower ball may be melted together to form an interconnection structure. For example, the solder 416 on the first core element 41 and the solder 426 on the second core element 42 may be melted together to form a first reflowable connector 40. The first core element 41, the second core element 42 and the first reflowable connector 40 form a first interconnection structure 4. The solder 716 on the third core element 71 and the solder 726 on the fourth core element 72 may be melted together to form a second reflowable connector 70. The third core element 71, the fourth core element 72 and the second reflowable connector 70 form a second interconnection structure 7.

Figure 11:
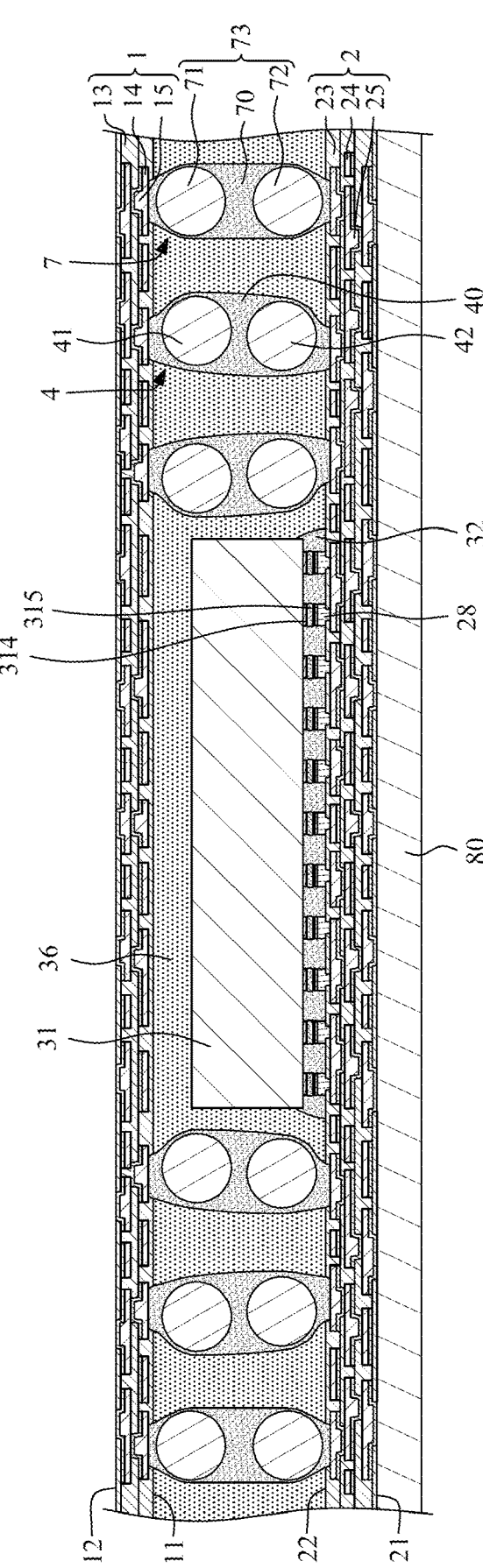
FIG. 11 illustrates one or more stages of an example of a method for manufacturing an electronic package structure according to some embodiments of the present disclosure.

Referring to FIG. 11, an encapsulant 36 may be formed or disposed between the upper circuit pattern structure 1 and the lower circuit pattern structure 2 to encapsulate the electronic device 31, the underfill 32 and the interconnection structure(s) such as the first interconnection structure 4 and the second interconnection structure 7. Then, the upper carrier 82 is removed.

Figure 12:
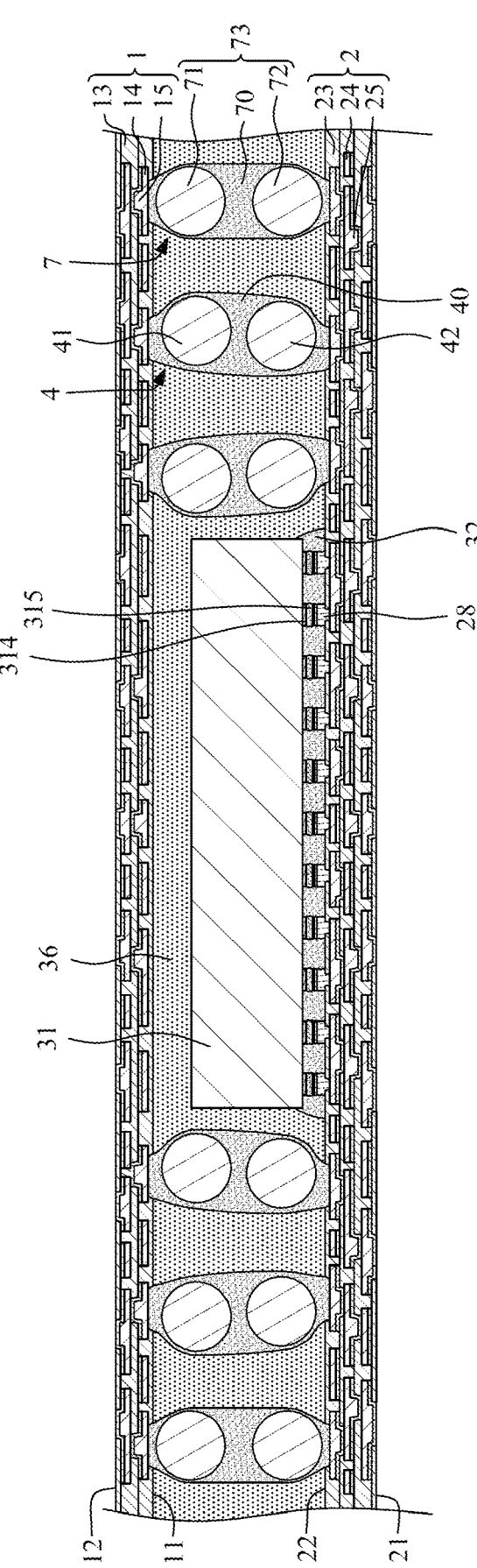
FIG. 12 illustrates one or more stages of an example of a method for manufacturing an electronic package structure according to some embodiments of the present disclosure.

Referring to FIG. 12, the lower carrier 80 is removed.

Figure 13:
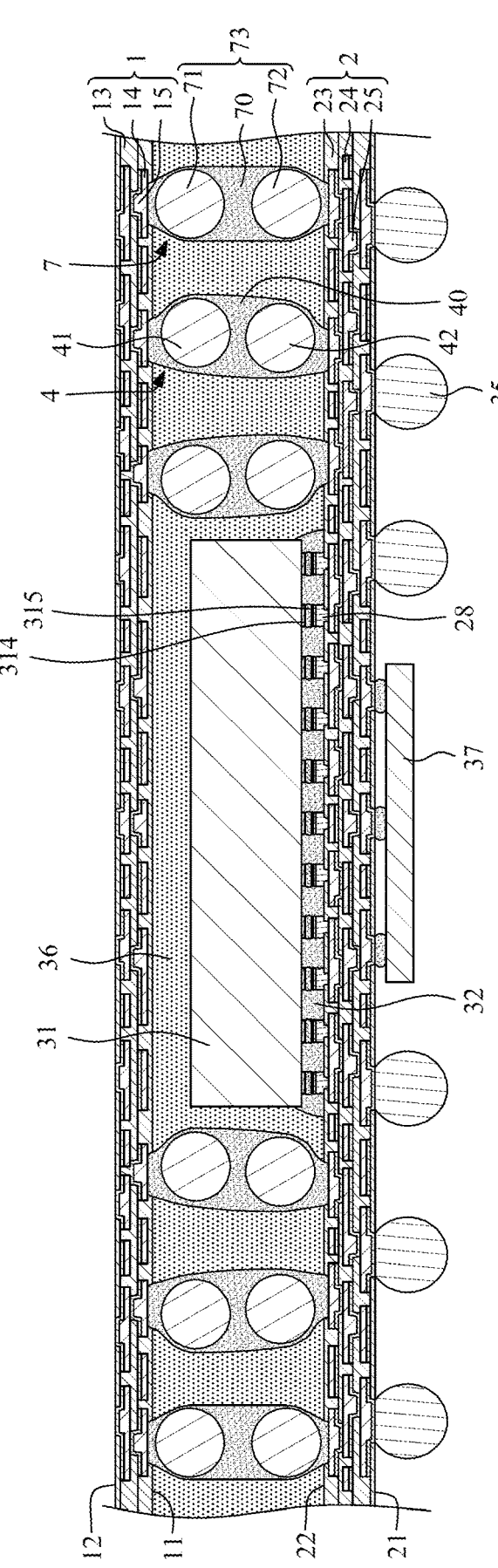
FIG. 13 illustrates one or more stages of an example of a method for manufacturing an electronic package structure according to some embodiments of the present disclosure.

Referring to FIG. 13, a capacitor 37 may be disposed under the electronic device 31, and may be electrically connected to the first surface 21 (e.g., the bottom surface) of the lower circuit pattern structure 2. A plurality of external connectors 35 (e.g., solder balls or solder bumps) are formed or disposed on the first surface 21 (e.g., the bottom surface) of the lower circuit pattern structure 2 for external connection.

Then, a singulation process is conducted to obtain a plurality of electronic package structures 3 of FIG. 1.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:
1. An electronic package structure, comprising:
a lower circuit pattern structure;

an upper circuit pattern structure disposed above the lower circuit pattern structure, and including a plurality of upper dielectric layers and a plurality of upper circuit layers;

a first reflowable connector electrically connecting the upper circuit pattern structure and the lower circuit pattern structure, wherein the first reflowable connector extends partially into the upper circuit pattern structure and connects to the plurality of upper circuit layers; and a first core element and a second core element attached to the first reflowable connector, and arranged substantially vertically between the lower circuit pattern structure and the upper circuit pattern structure, wherein the first core element does not contact the second core element, wherein the first core element and the second core element are spaced apart from the lower circuit pattern structure and the upper circuit pattern structure, wherein the lower circuit pattern structure includes a plurality of lower dielectric layers and a plurality of lower circuit layers, and the first reflowable connector further extends partially into the lower circuit pattern structure and connects to the plurality of lower circuit layers, wherein the first reflowable connector has a first edge having a first turning point and a second turning point, wherein a first portion of the first edge above the first turning point is convex and is conformal with an upper portion of the first core element, wherein a third portion of the first edge under the second turning point is convex and is conformal with a lower portion of the second core element.

2. The electronic package structure of claim 1, wherein the first reflowable connector further has a second edge opposite to the first edge, wherein a profile of the second edge is different from a profile of the first edge.

3. The electronic package structure of claim 2, wherein the first reflowable connector defines a recess recessed toward the first core element, wherein the recess intersects with the first portion of the first edge at the first turning point, and the first turning point is an inflection point.

4. The electronic package structure of claim 3, wherein the first reflowable connector includes a main portion, a first protrusion portion and a second protrusion portion, the main portion of the first reflowable connector is located within a region extending between an opening of the upper circuit pattern structure and an opening of the lower circuit pattern structure, the first protrusion portion and the second protrusion portion protrude from the main portion and are located at different sides of the main portion, wherein a width of an entirety of the first protrusion portion is different from a width of an entirety of the second protrusion portion at a same elevation.

* * * * *